United States Patent
Cui et al.

[11] Patent Number: 5,951,908
[45] Date of Patent: Sep. 14, 1999

[54] PIEZOELECTRICS AND RELATED DEVICES FROM CERAMICS DISPERSED IN POLYMERS

[75] Inventors: Changxing Cui, Bethesda, Md.; Ray Henry Baughman, Morris Plains; Zafar Iqbal, Morristown, both of N.J.; Theodore Robert Kazmar, Santa Clarita; David Keith Dahlstrom, Panorma, both of Calif.

[73] Assignee: Alliedsignal Inc., Morristown, N.J.

[21] Appl. No.: 09/003,625

[22] Filed: Jan. 7, 1998

[51] Int. Cl.$^6$ ...................................... H01L 41/18
[52] U.S. Cl. ..................... 252/62.9 R; 252/62.9 RZ; 524/413
[58] Field of Search ................ 252/62.9 R, 62.9 RZ; 524/413

[56] References Cited

U.S. PATENT DOCUMENTS

| | | | |
|---|---|---|---|
| 4,595,515 | 6/1986 | Wakino et al. | 252/62.9 R |
| 4,624,796 | 11/1986 | Ginoewicz | 252/62.9 |
| 4,675,123 | 6/1987 | Tsunooka et al. | 252/62.9 R |
| 4,944,891 | 7/1990 | Sagong | 252/62.9 |
| 5,043,622 | 8/1991 | Sagong | 310/358 |
| 5,702,629 | 12/1997 | Cui et al. | 252/62.9 R |

OTHER PUBLICATIONS

Han et al.; Colloidal Processing for Improved Piezoelectric Properties of Flexible 0–3 Ceramic–Polymer Composites; J. Am. Ceram. Soc. 74, 1991; pp. 1699–1701 no month.

Waller et al.; Polling of Lead Zirconate Titanate Ceramics and Flexible Piezoelectric Composites by the Corona Discharge Technique; J. Am. Ceram. Soc. 72; 1989; pp. 322–324 no month.

Tandon et al.; Journal of Materials Science Letters 12; 1993; pp. 1182–1184 no month.

Klein et al., Composite Piezoelectric Paints; Proceedings of the Sixth IEEE International Symposium on Applications of Ferroelectrics; Jun. 8–11 1986; pp. 285–289 no month.

Pohanka et al.; Recent Advances in Piezoelectric Ceramics; pp. 45–145 (no date).

*Primary Examiner*—C. Melissa Koslow
*Attorney, Agent, or Firm*—Loria B. Yeadon

[57] ABSTRACT

This invention relates to compositions and processes for the fabrication of piezoelectric composites having improved figures of merit for both sensor and non-sensor applications. These composites comprise piezoelectric particles embedded in a polymer matrix. The improvements of this invention result from discoveries of the effects of polymer bulk compliance, polymer anisotropy, polymer melt index, and polymer/ceramic wettability on performance. The loss corrected figure of merit ($g_h d_h$/tan$\delta$) obtained for the 0–3 composites is as high as $10.5 \times 10^{-10}$ m$^2$/N, which is about four times higher than previously published for 0–3 composites of the prior art. Methods are described for the introduction of anisotropy into ceramic particle/polymer composites, so that cancellation effects that degrade the piezoelectric properties of composites can be reduced.

23 Claims, 1 Drawing Sheet ic. Also, a ceramic-polymer composite containing a continuous polymer matrix and parallel ceramic rods that transverse the composite is called a 1-3 composite. Likewise, a ceramic-polymer composite in which isolated ceramic particles are embedded in a three-dimensionally continuous polymer phase is called a 0-3 composite. Because of uncertainties that typically exist regarding the degree of association between ceramic powder particles, an index of zero is used herein to refer to this component, independent of such association. While such definition differs from one entirely based on the connectivity of possibly aggregated powder particles, it permits convenient description of results from the prior art—where the connectivity of the powder particles is often unestablished.

PIEZOELECTRICS AND RELATED DEVICES FROM CERAMICS DISPERSED IN POLYMERS

BACKGROUND OF THE INVENTION

1. Field of the Invention

This invention relates to improved compositions and processing methods for piezoelectric ceramic/polymer composites, and related devices utilizing such composites.

2. Description of the Prior Art

Piezoelectric ceramics and piezoelectric polymers both provide useful sensor materials. Unfortunately, each offers limited advantages. The large longitudinal ($d_{33}$) piezoelectric charge coefficient (typically about 200 pC/N) and high dielectric constant (typically about 1,000) of piezoelectric ceramics make them nearly ideal for applications where the frequency is well over 500 kHz. They also provide a large piezoelectric response and good electrical impedance match with the interface electronics. Hence, piezoelectric ceramics are widely used in medical ultrasonic image applications where the operational frequency is typically between 1 MHz and 50 MHz. In contrast with the situation at the above high frequencies, the sound pressure exerted on a piezoelectric sensor is effectively hydrostatic at frequencies below 100 kHz, because the wavelength of sound in media such as air and water is much larger than the dimension of the sensor. In such case the piezoelectric ceramics have a problem. This problem arises since the hydrostatic charge coefficient ($d_h$) equals $d_{33}+2d_{31}$ when $d_{31}=d_{32}$, and $d_{33}$ is typically about equal to $-2d_{31}$ and $d_h=d_{33}+2d_{31}$. Hence, the hydrostatic charge coefficient is typically much smaller than $d_{33}$. Another problem with piezoelectric ceramics is that they have a very high acoustic impedance, because of a high density and high elastic modulus. This leads to a mismatch in acoustic impedance between sensors and media such as air or water. In addition, the high mechanical quality of the piezoelectric ceramic causes ringing within sensors, and hence a damping layer is sometimes necessary.

On the other hand, piezoelectric polymers are flexible and have an acoustic impedance that is closer to water and human tissue than piezoelectric ceramics. However, they have a low piezoelectric charge coefficient ($d_{33}$ typically about 25 pC/N) and a low dielectric constant (typically about 10). This results in a low piezoelectric response and low capacitance, which causes difficulties for matching the sensor electrical impedance with the interface electronics. Also, the current piezoelectric polymers cannot be operated at very high temperatures (typically above 70° C.), since they depole.

The above analysis indicates that piezoelectric ceramics and piezoelectric polymers cannot meet various conflicting requirements for the broadest range of transducer applications. For this reason, composite materials consisting of piezoelectric ceramics and polymers have been investigated, which potentially combine the advantages of the piezoelectric ceramics and piezoelectric polymers. Here, it important to differentiate between fundamentally different types of composites that have been described by Newnham, Skinner, and Cross (Mat. Res. Bull. 13, 1978, pp. 525–536). These composites are indicated according to the connectivity of the ceramic and polymer components. Zero-, one-, two-, and three-dimensional connectivities are denoted by the indices 0, 1, 2, and 3. The index of the ceramic component is listed first, and this index is followed by that of second component. Hence, a ceramic-polymer composite in which both phases have three-dimensional connectivity is called a 3-3 compos- A problem with many of the prior art sensor technologies of composites relates to the achievable piezoelectric coefficients and the values of electrical loss, which are best considered by describing figures of merit. One figure of merit for piezoelectric composites for long range and low frequency applications is how much electrical energy can be generated (per unit volume of piezoelectric material) in response to one unit change in pressure. This figure of merit is called the hydrophone power figure of merit. It can be expressed in terms of the hydrostatic piezoelectric voltage and charge piezoelectric constants ($g_h$ and $d_h$, respectively) as $g_h d_h$. When this figure of merit is exclusively used, all piezoelectric materials are assumed to have the same dielectric loss, which is an invalid assumption unless they have such a small dielectric loss that the contribution of dielectric loss to noise can be ignored. Typically, the dielectric loss of piezoelectric materials can vary from 0.001 to above 0.1. Most composite materials of the prior art have significant dielectric loss that generates large sensor-self noise— Johnson noise that is directly proportional to dielectric loss. Hence, a particularly useful sensor figure of merit includes dielectric loss. After taking into account the dielectric loss ($\tan\delta$), the figure of merit can be rewritten as $g_h d_h/\tan\delta$. This figure of merit determines the sensor signal-to-noise ratio, which is the ultimate measurement of sensor materials performance.

The 1-3 piezoelectric composites have been extensively investigated. For example, such 1-3 composites are fabricated using PZT rods that are extruded, sintered, and hot-pressed. These rods are aligned in parallel within a mold. After backfilling polymer into the mold, the composite fabrication is completed cutting plates perpendicular to the rod direction. Although the properties of such composites are attractive and reproducible, this fabrication process is time consuming and costly. Such 1-3 composites can offer a figure of merit as high as $20\times10^{-13}$ m$^2$/N without the use of any mechanical transformer (Pohanka, et al., in "Electronic Ceramics", Levinson, L. M. Ed. Marcel Dekker Inc., New York, 1987, pp.45–147). Also, 1-3 composites made from polyurethane foam can offer a $g_h d_h$ value of $200\times10^{-13}$ m$^2$/N. However, the porosity of such polyurethane foams causes problems in practical applications.

The 1-3 composites do not provide a cost effective alternative to 0-3 composites. Also, the 0-3 piezoelectric ceramic particle/polymer composites of the prior art typically have serious problems because of high dielectric loss, moderate figures of merit, and a sensitivity dependence on hydrostatic pressure loading. U.S. Pat. No. 4,624,796 to Newnham et al. (and Proceedings of 1986 IEEE International Symposium on Applied Ferroelectrics, 1986, pp. 285–289) claimed a 0-3 composite with a reasonably high $g_h d_h$ value of $38\times10^{-13}$ m$^2$/N, but the reported dielectric loss of the composite was as high as 0.1. Banno et al. (Japanese J. Appl. Phys. 26, 1987, pp. 153–155) demonstrated that the 0-3 piezoelectric ceramic particle/polymer composite could achieve a $g_h d_h$ value as high as about $50 \times 10^{-13}$ m$^2$/N, but the dielectric loss was also quite high (0.03–0.05). Han et al. (J. Am. Ceram. Soc. 74, 1991, pp. 1699–1701) reported similar composites with a comparable $g_h d_h$ value and dielectric loss of 0.04 to 0.08. Waller et al. (J. Amer. Ceram. Soc.72, 1989, pp. 322–324) and Tandon et al. (Journal of Materials Science Letters 12, 1993, pp. 1182–1184) have described the fabrication and evaluation of 0-3 composites of piezoelectric ceramics in a host polymer that is non-piezoelectric. Also, Giniewicz et al. have described (U.S. Pat. No. 4,624,796) fabrication of 0-3 ceramic-polymer composites of a ceramic comprising a PbTiO$_3$-BiFeO$_3$ solid solution (with partial substitution of iron by manganese) in an insulating polymer. Ceramic powder loadings claimed for obtaining the highest sensitivity sensors were in the range of 50–75 volume percent, and preferably 60–75 volume percent. Despite such high volume percentages of ceramic (60%), the maximum observed $d_h$ and $d_h g_h$ did not exceed 35 pC/N and $35 \times 10^{-13}$ m$^2$/N, respectively. In related work, Sa-Gong et al. have reported (U.S. Pat. Nos. 4,944,891 and 5,043,622) fabrication of 0-3 composites of an insulating matrix polymer, a piezoelectric ceramic, and a conducting additive (such as carbon, silicon, or germanium) to enhance the pole-ability of the ceramic. U.S. Pat. No. 5,043,622 shows that a PZT particle/epoxy composite has a low $g_h d_h$ value of $4 \times 10^{-13}$ m$^2$/N and a dielectric loss as high as 0.08.

The problem of high loss (i.e., high tan$\delta$) piezoelectrics of the prior art results in a high sensor Johnson noise, which is proportional to (tan$\delta$)/$\omega$C (where C is the capacitance of the sensor and $\omega$ is the angular frequency). The Johnson noise can be decreased by either reducing the dielectric loss of the material or increasing the sensor capacitance, while keeping the sensor operational frequency range constant. Increasing the sensor capacitance by increasing electrode area (keeping thickness constant) is equivalent to increasing the volume of the sensor materials used. The use of a larger volume of sensor materials is often undesirable because the sensor can become too bulky, heavy, and costly. Thus, the preferred way to make better piezoelectric sensors is to use sensor materials having a high $d_h g_h$ value and a low dielectric loss. The present invention describes how to make 0-3 piezoelectric composite materials having both very high $d_h g_h$ and $g_h d_h$/tan$\delta$ figures of merit, This means that the piezoelectric composites of the present invention provide much higher volumetric capacities for the generation electrical energy from applied stresses, as well as dramatically improved signal-to-noise capabilities for sensors, compared with 0-3 composites of the prior art.

SUMMARY OF THE INVENTION

The invention provides a piezoelectric composite comprising a first component that is a piezoelectric powder and a second component having three-dimensional connectivity that comprises a polymer, wherein (a) the first component comprises substantially spherical piezoelectric particles such that at least about 90 weight percent of the particles have diameters within 20% of the weight-average of the particle diameters, and the weight-average of the particle diameters ranges from about 30 μm to about 200 μm;

(b) either (1) the polymer substantially adheres to the first component when a pellet of the polymer is fully melted and then resolidified on top of a pellet of the first component or (2) the polymer, which is formed by reaction and solidification of a fluid precursor of the polymer, substantially adheres to a pellet of the first component when said reaction and solidification is done on top of a pellet of the first component;

(c) the dielectric loss of said polymer is less than about 0.02 at 1 kHz, (d) the melt index of said polymer exceeds 0.1 at a temperature within 40° C. of the polymer melting temperature if said polymer has a melting temperature;

(e) the total volume of all components of the composite other than the second component ranges from about 50 volume percent to about 74 volume percent of the composite; and (f) the elastic compliance $S_{33}$ of the piezoelectric composite ranges from about $1.5 \times 10^{-10}$ to about $6.0 \times 10^{-10}$ m$^2$/N.

The invention also provides a process for forming an article which comprises i) forming the above piezoelectric composite; and ii) forming a shaped article from said composite and imparting anisotropic properties to the shaped article by subjecting it to one or more treatments selected from the group consisting of uniaxially draw, uniaxial compression, biaxial draw, biaxial compression, and shear deformation.

The invention further provides a process of forming a composite comprising a first component that is the above piezoelectric powder, a second component having three-dimensional connectivity that comprises the above polymer, and a third component comprising a fibrous material or a plate-like material wherein the process comprises commingling the second component and third component to form an intimate mixture and then commingling the intimate mixture with the first component.

The invention still further provides a process of forming the above piezoelectric composite, the process comprising mixing the first component and second component either as dry powders or as dry powders in combination with substantially a non-solvent for the first component and second component to form a free-flowing mixture and then forming this free-flowing mixture into a shaped composite by melting the second component.

The invention also provides a process of forming the above piezoelectric composite, the process comprising forming a mixture of the first component and a monomer or prepolymer, followed by reaction of said monomer or prepolymer under conditions sufficient to produce the second component.

BRIEF DESCRIPTION OF THE DRAWINGS

The invention will be more clearly understood and further applications will be apparent when reference is made to the accompanying drawing, in which.

DETAILED DESCRIPTION OF THE INVENTION

Figure 1:
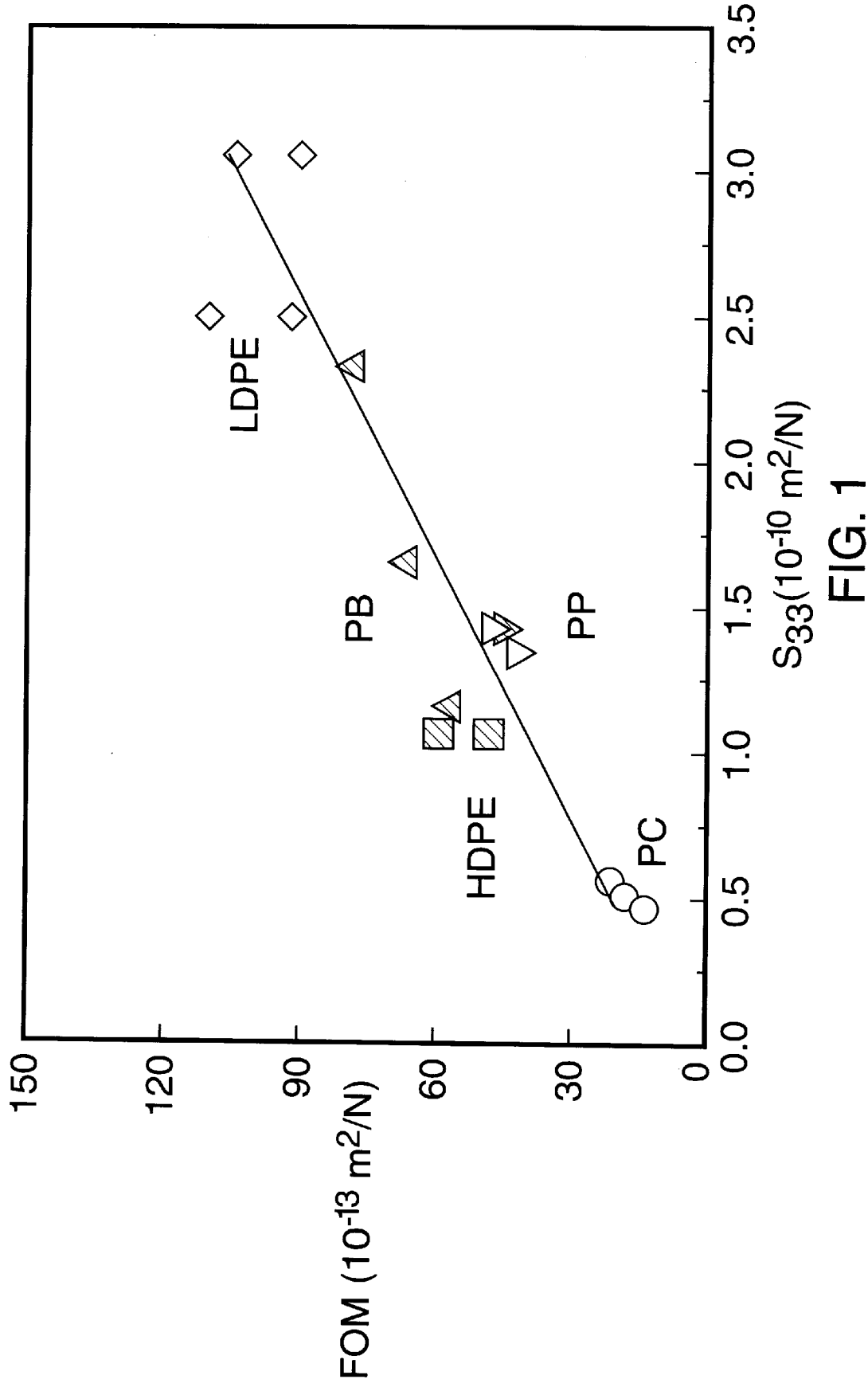
FIG. 1 is a plot showing the dependence of the measured figure of merit ($g_h d_h$) on measured elastic compliance $S_{33}$ for piezoelectric composites. These composites utilized about a 65% by volume loading level of Ca-PT in an organic polymer matrix. The organic polymers used in this study have a dielectric constant between 2.2 and 2.5. The symbols on the figure denote low density polyethylene [LDPE], high density polyethylene [HDPE], poly(1-butene) [PB], polycarbonate [PC], and polypropylene [PP].

For simplicity, this initial part of the description of the invention is for the case where the piezoelectric has isotropic in-plane properties, so that $d_{31} = d_{32}$.

Since the value of $d_hg_h/\tan\delta$ determines the minimum signal that the piezoelectric sensor can detect, the present invention focuses on maximizing this figure of merit. This is accomplished by maximizing $g_hd_h$ and minimizing $\tan\delta$. The piezoelectric hydrostatic charge coefficient can be written in terms of electromechanical coupling constants and elastic compliances as follows:

$$d_h = k_{33}(\epsilon\epsilon_0 S_{33})^{1/2} - 2k_{31}(\epsilon\epsilon_0 S_{11})^{1/2}, \quad (1)$$

where $k_{33}$ and $k_{31}$ are the longitudinal and transverse electromechanical coupling constants, $S_{33}$ and $S_{11}$ are the longitudinal and transverse elastic compliances, respectively, $\epsilon$ is the dielectric constant, and $\epsilon_0$ is the vacuum permittivity. Using this relationship, we have $$g_h d_h = d_h^2/\epsilon\epsilon_0 = [k_{33} S_{33}^{1/2} - 2k_{31} S_{11}^{1/2}]^2 \quad (2)$$

The present invention uses various methods for maximizing $g_hd_h$. Consider first the case where the piezoelectric ceramic has a very low transverse electromechanical coupling constant (i.e., $k_{31}$ is close to zero). For such materials Eq. 2 can then be approximately rewritten as $$g_h d_h = k_{33}^2 S_{33}, \quad (3)$$

so that $g_hd_h$ is a linear function of the longitudinal elastic compliance. Consequently the choice of materials for the composite that result in a large value of $S_{33}$ will result in a high $g_hd_h$. Preferred examples of piezoelectric ceramics having very low transverse electromechanical coupling constant are lead titanate, Ca-modified lead titanate, Sm-modified lead titanate, and lead metaniobate. The above argument indicates that when this type of piezoelectric ceramics is used in the composite preparation, $g_hd_h$ can be optimized by selecting a matrix component that has a large value of $S_{33}$.

The longitudinal electromechanical coupling constant $k_{33}$, whose upper limit is 1, should also be maximized in order to maximize $g_hd_h$. Such maximization is challenging, because the electromechanical coupling constant of the 0-3 composite materials is a function of numerous variables (such as the polymer matrix mechanical properties, the interfacial interaction between piezoelectric ceramics and polymers, and the electromechanical properties of the piezoelectric ceramic component). Nevertheless, the present invention provides some guidance for the choice of materials for the optimization of $k_{33}$. Specifically, a piezoelectric ceramic component having a high electromechanical coupling constant is preferable in order to obtain a high coupling constant for the composite.

Note that the piezoelectric charge coefficient (d) can be maximized by using a polymer matrix that has a low compliance and a high dielectric constant. This is because $d = k(\epsilon\epsilon_0 S)^{1/2}$, where $\epsilon$ is the dielectric constant of the composite (and where $\epsilon$ increases with increases in either the dielectric constant of the polymer or ceramic component). A composite having a high d value is desirable for obtaining an actuator that provides a high change in dimension for a given applied voltage. However, designing a composite to provide a high d value does not necessarily result in a high figure of merit. This is because the figure of merit is $FOM = d^2/(\epsilon\epsilon_0)$.

When piezoelectric ceramic particles with a very small $k_{31}$ value are used to prepare composite materials, $g_hd_h$ can be tailored to needs by varying the modulus of the composite. The bulk modulus of a composite consisting of hard spherical particles in a polymer matrix can be approximately written as $$K = K_0\{(3+4G_0/K_1) - 4G_0(1/K_1 - 1/K_0)V_1\}/\{(3+4G_0/K_1) - 3K_0(1/K_1 - 1/K_0)V_1\}, \quad (4)$$

where $K_0$ and $G_0$ are the bulk and shear moduli of the polymer matrix, $K_1$ is the bulk modulus of the hard spheres, and $V_1$ is the volume fraction of hard spheres. The important result from this equation is that K is approximately a linear function of the volume fraction of spheres, and varies from $K_0$ to $K_1$.

Eq. 4 shows that a high volume fraction of soft polymer component in piezoelectric composites is desirable in order to obtain the high $S_{33}$ that provides a high $d_hg_h$ value from Eq. 3. However, Eq. 3 also shows that the piezoelectric response of the composite materials is proportional to $k_{33}$, which increases with increasing fraction of ceramic particles. This volume fraction of ceramic is preferably less than about 74% if the ceramic particles are spherical and uniform in diameter. Otherwise air cavities are introduced which make the poling of the composite very difficult or impossible. This limit can be slightly higher if polydispersed ceramic particles that are differently sized are used. Also, the volume fraction of ceramic is preferably above 50%.

When the volume fraction of the piezoelectric ceramic power is fixed, the elastic compliance of the matrix component should be as high as possible in order to maximize $g_hd_h$ and $g_hd_h/\tan\delta$. As demonstrated in the examples of this invention, the $g_hd_h$ value can be varied from $15 \times 10^{-13}$ m$^2$/N to about $130 \times 10^{-13}$ m$^2$/N for the same piezoelectric ceramic powder by using different polymer components that have different elastic compliances.

The matrix component for the piezoelectric ceramics in this invention is not limited to those comprising a polymer (inorganic or organic), although an organic polymer is a preferred matrix component. Any matrix materials that can meet the specified requirements of this invention can be considered as the matrix component. Suitable matrix materials extend from polymers to organic and inorganic glasses, gels, and ceramics. However, the matrix material should preferably have as an elastic compliance that is at least 50% higher than that of the piezoelectric ceramic particles. When the elastic compliance of the matrix component is lower than that of the piezoelectric ceramic particles, the matrix will form a protective cage for piezoelectric ceramic particles which prevents transfer of the applied stress. As a result, the composite will have a $d_hg_h$ value that is lower than that of the corresponding pure piezoelectric ceramic. On the other hand, the resulting composite is not practical if the matrix is too soft. The elastic compliance $S_{33}$ of the piezoelectric composite consisting of piezoelectric particles dispersed in a host matrix is preferably above about $1.5 \times 10^{-10}$ and below about $6.0 \times 10^{-10}$ m$^2$/N. An elastic compliance in this range is obtained for a given piezoelectric by selecting the bulk modulus of the host matrix and the loading level of the piezoelectric ceramic so that the desired composite compliance results. The bulk modulus of the preferred matrix polymers of this invention are below about $4 \times 10^9$ N/m$^2$ and above about $1 \times 10^9$ N/m$^2$, which corresponds to a preferred bulk compliance of greater than about $2.5 \times 10^{-10}$ m$^2$/N and less than about $1 \times 10^{-9}$ m$^2$/N.

If polymers are used as matrix components, the matrix elastic compliance can be tuned by adding various plasticizers. Examples of such plasticizers are dioctyl phthalate and other phthalates, sebacates, citrates, and phosphate esters.

The elastic compliance is not the only consideration relevant for the choice of the matrix phase. The interfacial interaction between the matrix component and piezoelectric ceramic particles is just as important as the elastic compliance in influencing the performance and processability of the composite materials. If the matrix component is not piezoelectrically active, applied stress must be interfacially transmitted from the matrix phase to the ceramic phase. The degree of this stress transfer largely depends on the characteristics of the interface. It is preferable that the matrix and ceramic phases be in direct contact. In other words, it is prefer that the there exists no substantial void volume in the composite. To insure this situation, the ceramic and polymer should wet. The reason is that if no wetting occurs between the piezoelectric ceramic and matrix phases, the intervening space between ceramic particles and host matrix will include voids.

An example of this undesirable lack of wetting was indicated when polytetrafluoroethylene (PTFE) was used to make 0-3 piezoelectric ceramic particle/polymer composites. These composites have very low dielectric strength because of the presence of the intervening air phase between the piezoelectric ceramic particles and the matrix component. Such entrapped air prohibited poling, and also prevents the efficient transfer of stress from the matrix phase to the ceramic phase. Also, such entrapped air will increase the interfacial polarization between ceramic particles and the matrix, which leads to higher dielectric loss in the low frequency range (since the interfacial polarization is a major contributor to low frequency dielectric loss, after ionic or electronic conductivity). On the other hand, if the matrix component wets the ceramic particles, this component can diffuse into the gaps between the ceramic particle to form a cavity-free composite. For these reasons, it is preferred in the present invention that the matrix component should wet the piezoelectric ceramic particles.

For the purposes of the present invention, a matrix material wets the ceramic particles if any one of the following tests is satisfied. In the first test a matrix phase pellet is placed on top of a piezoelectric ceramic disk and this assembly is placed in an oven at a temperature which is at least 10° C. higher than the melting point of the matrix component. Then, the oven is cooled down to room temperature and the adhesion between polymer and ceramic is evaluated. If this test shows that significant bonding occurs between the polymer and piezoelectric ceramic disks, then this indicates that a significant amount of wetting has occurred. On the other hand, if no such significant bonding is observed, a second test is utilized. In this test the contact angle between the molten polymer and a ceramic disks is examined. For the purposes of this invention, wetting is indicated if the contact angle between the molten polymer and the ceramic is less than 90°.

Surface modification agents can be used to enhance the interactions between the ceramic particles and matrix phases of this invention. Using such agents it is possible to change a non-wetting matrix material into a wetting matrix material. These agents should contain an organic group capable of providing wetting between the agents and polymers, as well as an inorganic group which can interact with the metal ions or oxygen on the surface of the ceramic particles. Examples of such surface modification agents are commonly used surfactants, as well as specially designed surface activating agents, such as vinyltriethoxysilane and vinyltrichlorosilane. Specially preferred agents are, for example, organometallic or organosilicon compounds, applied to the surface of the piezoelectric ceramic particles.

Curable resins such as epoxy and polyurethane resins can be used to make 0-3 composites according to the present invention. It is preferred that each component of the resin can wet the piezoelectric ceramic particle to a reasonable degree, so that air gaps will not be introduced into the interfacial region during the curing process. For such curable resins a modified wetting test is necessary, since many of these resins are not fusible. The wetting test is carried out by placing a small drop of the mixture of resin and the hardening agent on the surface of the piezoelectric ceramic disk. A wetting angle of less than about 90° is preferred as an indication of wetting. If the resin or hardening agent is not liquid at room temperature, such wetting test can be accomplished at a temperature of at least about 10° C. above the temperature at which the highest melting above-mentioned component melts. The polymeric materials resulted from the curing of the resin should also be able to wet the piezoelectric ceramic particles. As a test of the wettability of the resulting polymeric materials over the ceramic particle, a method that is analogous to that above described previously for fusible polymers is recommended to determine whether the polymeric material is able to wet the piezoelectric ceramic particles. This can be done by placing a mixture of the resin and hardening agent on a piezoelectric ceramic disk. Then, the mixture is cured at desired temperatures. If the resulting polymer does not easily separate from the disk after the cure step, wetting is indicated.

The melt index (MI) of the matrix component should be appropriately selected for the fabrication of piezoelectric ceramic particle/polymer composites by melt phase processing methods. The melt index determines the ability of the polymer to flow when the polymer is melted at particular temperatures. Generally, the higher the polymer molecular weight for a particular type polymer the lower the melt index. Assuming that the polymer is able to wet the piezoelectric ceramic particles, the higher the polymer melt index, the shorter time or the lower the pressure needed for the polymer to fully fill a matrix of ceramic particles. Depending on the processing method selected, polymers with different melt indices are suitable. For example, if the processing method insures the thorough mechanical mixing of small polymer particles with ceramic particles, a lower melt index could be used than would otherwise be the case. Preferably the melt index of the polymer matrix component exceeds 0.1 by the ASTM D1238 standard test within 40° C. of the polymer melting temperature. More preferably, the melt index of the polymer matrix component exceeds 0.5 by the ASTM D1238 standard test within 40° C. of the polymer melting temperature. The ASTM D1238 standard test is described by Buchoff in Chapter 111, pages 1561–1569 of "Handbook of Plastic Materials and Technology", I. I. Rubin Ed. (Wiley, N.Y., 1990). As described therein, this test is conducted by determining the amount of molten polymer that is extruded through a specified geometry orifice in a specified time under a specified load.

The preferred composite processing method of this invention is a "dry method" that does not necessarily require the use of any solvents or any prior melt treatments. The first step is to mix the piezoelectric ceramic powder with the polymer powder to form a uniform mixture. A liquid can be used to facilitate this mixing step, although this liquid need not be a solvent. Then, the powder mixture is placed into a die and hot-pressed (at above the polymer melting point) into the desired configured sensor (such as a disk or cylinder). When this processing method is used, the particle flow characteristics and particle sizes of the piezoelectric ceramic and polymer components become critical. A freeflowing powder mixture is preferred, since such a mixture facilitates die filling during manufacture processes.

It is preferred that the piezoelectric particles are nearly spherical in shape and that at least about 90 weight percent of the particles have diameters within 20% of the weight-average of the particle diameters. The preferred particle size of the polymer component before melt processing is from about 10 $\mu$m to about 200 $\mu$m, as measured by the particle weight-average diameter. Also, the preferred particle size of the piezoelectric ceramic components is from about 30 $\mu$m to about 200 $\mu$m, as measured by the particle weight-average diameter. It is more preferred that one component has a particle size that is larger than about 30 $\mu$m, since this is important for the mixture to be free-flowing. The melt index of the polymer component can be a critical factor for choosing the particle size of the polymer component. The higher the melt index of the polymer component, the smaller the particle size should be. If the matrix component can easily wet the piezoelectric ceramic particle, large particle sizes can be selected since the molten matrix polymer readily infiltrates into gaps between ceramic particles. Preferably the melt index of the polymer matrix component exceeds 0.1 by the ASTM D1238 standard test within 40° C. of the polymer melting temperature. More preferably, the melt index of the polymer matrix component exceeds 0.5 by the ASTM D1238 standard test within 40° C. of the polymer melting temperature.

Various methods of melt-phase processing can be used as part of the above mentioned dry fabrication method. Examples of preferred melt-phase fabrication methods are hot-rolling, hot-pressing, extrusion, flat pressing, and injection molding. For the fabrication of more complex sensor shapes such as cylinders, injection molding and extrusion are especially preferred. In order to help avoid the formation of a porous structure, vacuum may be applied during the forming step for a piezoelectric composite articles. If a hot-pressing method is used, the stress used for compacting is preferably as high as can be conveniently applied without fracturing the ceramic particles. The preferred temperature for melt processing is at least about 5° C. above the melting point of the polymer matrix. More preferably, the temperature for melt processing is at least about 30° C. above the melting point of the polymer matrix. If the host polymer is a mixture of different polymers having different melting points, the preferred melt processing temperature is at least about 5° C. above the highest melting point component of the polymer mixture and more preferably at least about 30° C. above the highest melting point component of the polymer mixture. The pressure applied during processing is at least about 2000 psi, and more preferably at least about 10,000 psi, and most preferably at least about 30,000 psi. Such high pressure will effectively remove cavities in the composite, which is necessary in order to ensure that the hydrophones provide pressure independent performance.

The piezoelectric ceramic powder most preferably consists of nearly spherically shaped particles with uniform or very narrow particle size distribution. The average particle size of the ceramic powder used in the present invention is preferably from about 30 to about 200 $\mu$m and more preferably from about 40 to about 150 $\mu$m. This term average particle size denotes the weight-average particle diameter. The preferred ceramic particle loading level is from about 50 to about 74 volume percent piezoelectric ceramic particles. The more preferred loading level in this case is from about 55 to about 70 volume percent piezoelectric ceramic particles.

The choice of composition of the ceramic particles is dictated by the availability of high values of $d_{33}$, $d_h$, $G_{33}$, and/or $g_h$, combined with low dielectric loss. Examples of such compositions are Ca-modified lead titanate (Ca-PT), Sm-modified lead titanate (Sm-PT), or lead metaniobate (PN). These ceramics have a relatively high $d_h$ value (about 60 to 70 pC/N), a low dielectric loss (<0.005), and a low dielectric constant (about 250). A free-flowing piezoelectrically-active ceramic powder with a polydispersed particle size distribution can be conveniently prepared by calcinating a green free-flowing ceramic powder made by the spray-drying method. As is conventional, green ceramic powder and like terms denote the mixture of materials (generally oxides) that are reacted to form the piezoelectric ceramic. For device applications where a significant $d_{31}$ coefficient would degrade performance (due either to a reduced $d_h$ or to unwanted coupling to lateral vibrations), modified lead titanates such as either $(Pb,Ca)TiO_3$ or $(Pb,Sm)TiO_3$ are especially preferred compositions for the piezoelectric ceramic powder. The reason for this choice is that such partial substitution of the Pb sites by either Sm or Ca can reduce $d_{31}$ to near zero.

PZT (lead zirconate titanate, $PbZr_{1-x}Ti_xO_3$) is an especially preferred ferroelectric ceramic having high piezoelectric $d_{33}$ coefficients.

Other compositions that are preferred for the practice of this invention are $K_xNa_{1-x}NbO_3$, where x is between 0 and 0.5, $Na_{1-x}Li_xNbO_3$, where x is 0.02 to 0.13, $Na_{0.75}Pb_{0.125}NbO_3$, $Pb_{0.95}Bi_{0.05}(Ti_{0.975}Zn_{0.025})O_3$, $Pb_{0.95}Bi_{0.033}(Ti_{0.95}Zn_{0.017}Nb_{0.033})O_3$, $Pb_{0.9625}La_{0.025}(Ti_{0.99}Mn_{0.01})O_3$, $Pb(Ti_{0.95}Zn_{0.017}Nb_{0.033})O_3$, $Pb(Ti_{0.606}Zr_{0.394})O_3$, $Pb(Ti_{0.526}Zr_{0.48})O_3$, $Pb_{0.985}Bi_{0.01}(Ti_{0.085}Zr_{0.915})O_3$, $Pb_{0.95}Mg_{0.05}(Ti_{0.54}Zr_{0.43}Cr_{0.03})O_{2.085}$, $Pb_{0.985}La_{0.01}(Ti_{0.085}Zr_{0.915})O_3$, $Pb_{0.988}(Ti_{0.42}Zr_{0.58})Nb_{0.024}O_3$, $Pb_{0.995}(Ti_{0.074}Zr_{0.916}Sb_{0.010})O_3$, and $Na_{0.5}Bi_{0.5}TiO_3$. Certain of the above compositions can be more compactly described by the formula $M_xM'_{1-x}NbO_3$, wherein M and M' are chosen from Na, Li, and K and x is less than unity. Other ceramic compositions from this preferred list can be more compactly described by the formula $Pb_xM''_v(Ti_yM_zM'_u)O_3$, wherein M and M' are selected from Zn, Nb, Zr, Sb, and Mn, M" is selected from Bi, La, and Nb, both x+v and y+z+u are about 1, and v is no more than about 0.05.

Relaxor ferroelectrics that are preferred for the present invention have the lead titanate type of structure ($PbTiO_3$) and disorder on either the Pb-type of sites (called A sites) or the Ti-type of sites (called B sites). Examples of such relaxor ferroelectrics having B site compositional disorder are $Pb(Mg_{1/3}Nb_{2/3})O_3$ (called PMN), $Pb(Zn_{1/3}Nb_{2/3})O_3$ (called PZN), $Pb(Ni_{1/3}Nb_{2/3})O_3$ (called PNN), $Pb(Sc_{1/2}Ta_{1/2})O_3$, $Pb(Sc_{1/2}Nb_{1/2})O_3$ (called PSN), $Pb(Fe_{1/2}Nb_{1/2})O_3$, (called PFN), and $Pb(Fe_{1/2}Ta_{1/2})O_3$. These are of the form $A(B\Phi_{1/3}B\Gamma_{2/3})O_3$ and $A(B\Phi_{1/2}B\Gamma_{1/2})O_3$, where $B\Phi$ and $B\Gamma$ represent the atom types on the B sites. Further examples of relaxor ferroelectrics with B-site disorder are solid solutions of the above compositions, such as $(1-x)Pb(Mg_{1/3}Nb_{2/3})O_3$-$xPbTiO_3$ and $(1-x)Pb(Zn_{1/3}Nb_{2/3})O_3$-$xPbTiO_3$. Another more complicated relaxor ferroelectric that is preferred for the present invention is $Pb_{1-x}^{2+}La_x^{3+}(Zr_yTi_z)_{1-x/4}O_3$, which is called PLZT. The components of the solid solution can be as follow: A is Pb; $B\Phi_{1/3}$ is $Mg_{1/3}$, $Ni_{1/3}$ or, $Zn_{1/3}$; $B\Gamma_{2/3}$ $Nb_{2/3}$; and $B\Phi_{1/2}$ and $B\Gamma_{1/2}$ are any two of $Sc_{1/2}$, $Ta_{1/2}$, $Fe_{1/2}$, and $Nb_{1/2}$.

The ceramic particles used in this invention must be piezoelectric. However, it is also preferred that these compositions be ferroelectric, meaning that there exists a polar direction and that an electric field applied along this polar direction can switch the dipole direction.

Various physical mixtures of chemically different ceramic powders are also useful for the polymer-ceramic composites of the present invention. These ceramic powders can include piezoelectric, ferroelectric, antiferroelectric, electrostrictive ceramics components, or any combinations thereof. However, the ceramic powders must include a component that is piezoelectric or ferroelectric. By the choice of the relative amounts of these different ceramic powders and the selection of poling processes, the $d_{33}$, $d_{31}$, and $d_h$ contributions due to the ceramic content of the composite can be conveniently adjusted according to application needs.

The selection of host polymer for ceramic particle/polymer composites of this invention is determined by a number of criterion, some of which depend on the targeted application. First, the polymer should wet the piezoelectric ceramic, either as prepared or as modified using a surface modification agent or surfactant. The above described criterion for wettability that is based on adhesive strength is most useful for selecting host polymers. However, it should be realized that this criterion is effected by some degree by the flow characteristics of the host polymer (as characterized by such parameters as melt index). This dependence of the wettability test on flow properties of the host polymer (or other host material) is in fact useful, since the ability to form high performance piezoelectric composites has a similar dependence on flow properties. The piezoelectric particles are dispersed in a host matrix having three-dimensional connectivity that comprises an organic polymer.

Second, the host polymer for the present invention embodiments should also exhibit low dielectric loss. This criterion excludes many popular polymers from interest for this application, such as the host of available hydrogen bonded polymers having high ionic conductivities. If convenient low temperature processibility is desirable, the host polymer can be one that has a low melting point. One especially preferred host polymer that has this characteristic is polyethylene. On the other hand, if high application temperature capabilities are required, a better choice of host polymer is one having a high melting point.

Third, if the goal is to maximize the $g_h d_h$ or $d_h g_h / \tan\delta$ figures of merit, the host polymer should have a low compressibility.

Especially preferred polymers for use as a host for Ca-modified lead titanate are low density polyethylene and poly(1-butene). No surface modification agents are required for such polymers used with Ca-modified lead titanate.

A polymer matrix with a required elastic compliance, wettability for the ceramic, flow characteristics may be optionally made by blending different polymers, or precursors thereof.

The polymer powder can be made by various methods. Some polymers are made by emulsion polymerization and can be directly synthesized in a powder form having particle sizes from about 0.5 to about 5 μm. Some polymers are synthesized by water phase polymerization under high pressure. Again these polymers are readily obtained as powders with an average particle size from about 0.1 to about 5 μm. When the polymer powder has to be prepared from pellets or other bulk forms, various milling methods can be used. Because each milling method is usually useful for only a limited group of polymers, there is no general solution as to which milling method is best. Two milling methods are preferred, which are freeze-milling and centrifugal milling. The milled particle size of the polymer is generally from about 50 to about 500 μm. When the polymer component can wet the ceramic particle, polymer particle size of 50 μm or larger are preferred (since such particle sizes provide good flow characteristics).

The polymer component also should not react with the piezoelectric ceramic component, and the piezoelectric ceramic component should not act as a catalyst to decompose the polymer component. For example, when the powder mixture of Ca-modified lead titanate and poly(vinylidene fluoride/trifluoethylene) copolymer (called PVDF-TrFE) was hot-pressed at 190° C., the copolymer underwent dehydroflourination reaction and hydrofluoric acid was released. Such polymer degradation processes generally lead to inferior sensor devices, as well as corrosion problems.

Various epoxies and polyurethanes provide especially preferred compositions for the invention embodiments. Examples are epoxy resins from Conap, Inc. (1405 Buffalo Street, Olean, N.Y. 14760–1139), such as CONACURE® EA-028 and EA-117. These compositions have the preferred high dielectric constants (4.7 and 4.1, respectively) and low dielectric loss (0.001 and 0.008, respectively, where both the dielectric constants and dielectric loss is measured at one kHz). Such epoxy compositions are conveniently commingled with piezoelectric powders and thereafter set at room temperature or higher temperatures to provide the composites of this invention.

In addition to the above methods for forming a ceramic/polymer composite of this invention, such composites can be formed by dispersion of the ceramic powder in either a prepolymer or monomer for the piezoelectric polymer, and then providing the final matrix polymer composition by reaction of the prepolymer or polymer. For example, this reaction can be conveniently accomplished by thermal processes or the effects of actinic radiation, such as ultraviolet, electron-beam, or γ-ray radiation. Epoxy compositions that are obtained by thermal reaction, especially reactions at close to room temperature, are preferred compositions for use in such methods of forming the composites of the present invention.

The dielectric loss of the 0-3 piezoelectric ceramic particle/polymer composite is determined by the dielectric losses of their constituents. A simple rule is that the lower the dielectric loss of the constituents, the lower the dielectric loss of the composite. The dielectric loss of a polymer component is preferably lower than about 0.02 at one kHz. More preferably, the dielectric loss of both the piezoelectric ceramic and the polymer components are lower than about 0.01 at one kHz. Reflecting the present preference that the dielectric loss is as low as possible, it is preferable that the polymer component has a low ionic or electronic conductivity. This is in contrary to prior art technologies where conductivity enhancement aids (such as carbon and semiconductor powders) are used to confer high conductivity to the polymer matrix component for 0-3 ceramic particle/polymer composites (J. Mat. Sci. Lett. 12, pp. 1182–1184, 1992, U.S. Pat. No. 4,944,891, and U.S. Pat. No. 5,043,622).

When piezoelectric ceramics do not have a small $k_{31}$, the selection method for the matrix material can be usefully modified so as to maximize $g_h d_h$. The lead zirconate titanate (PZT), barium titanate (BT), and the lead magnesium niobate-lead titanate (PMN-PT) relaxor piezoelectric ceramics have this characteristic. Because PZT, BT, and the PMN-PT relaxor ceramics are most widely used in sensor applications, it is very important to find an effective method for maximizing the value of $g_h d_h$ for corresponding 0-3 composites. The longitudinal electromechanical coupling constant $k_{33}$ is approximately related to the transverse electromechanical coupling constant $k_{31}$ for these family piezoelectric ceramics by the following relationship $$k_{33} \sim 2 k_{31} \qquad (5)$$

Substituting Eq. 5 into Eq. 2, we have $$g_h d_h \sim k_{33}^2 [S_{33}^{1/2} - S_{11}^{1/2}]^2 \qquad (6)$$

The longitudinal elastic compliance $S_{33}$ is not much larger than the transverse elastic compliance $S_{11}$ for the PZT, BT, and PMN-PT relaxor family of piezoelectric ceramics. Therefore, their $g_h d_h$ value is very small (generally less than $10^{-13}$ m²/N). If the PZT and BT piezoelectric ceramic particles are embedded in an isotropic polymer matrix, each ceramic particle will experience a hydrostatic pressure when a hydrostatic pressure is applied to the composite. Hence, Eq. 6 indicates that the ceramic particles will not make a large contribution to the $g_h d_h$ value of the ceramic particle/polymer composite.

The present invention shows that this problem can be largely eliminated if the polymer matrix is suitably made anisotropic. In such case each piezoelectric ceramic particle in the polymer matrix is subject to an anisotropic stress (that is higher in either the longitudinal or transverse direction), rather than a hydrostatic pressure. This means that the cancellation effect can be avoided, so that the individual ceramic particles make a significant contribution to the $g_h d_h$ value of the piezoelectric composite. In other words, because of the anisotropy of the host matrix the term $[S_{33}^{1/2} - S_{11}^{1/2}]$ in Eq. 6 is enhanced and a high $g_h d_h$ results.

There are many different methods that can be used in this invention embodiment to make the polymer matrix anisotropic. One of the preferred methods is a uniaxial hot-pressing method. For example, squeezing a solid or melt by applying pressure to a plunger in a cylindrical cell will introduce a degree of biaxial chain alignment orthogonal to the cylinder axis. If the cylinder axis direction is the direction of poling, which is the preferred case, then this anisotropy can be expressed as $S_{33} > S_{11}$. Such anisotropy can be a result of anisotropic chain alignment, as well as anisotropy in the contacts between ceramic particles. As a result of this anisotropy, the electromechanical coupling in the poling direction is enhanced and the electromechanical coupling in the lateral direction is decreased, as compared with the case of an isotropic matrix. The net result of the lateral compliance being lower than the longitudinal compliance is that the ratio of $d_{33}$ to $d_{31}$ is increased. Anisotropy can also be obtained by shear deformation such as by shearing a material between oppositely rotating cylinders.

This above described situation where the elastic anisotropy of the matrix enhances the natural anisotropy of the ceramic particles is preferable for sensor applications. This surprising result is experimentally demonstrated in examples of this invention. More specifically, an anisotropically processed composite made from the PZT-5H and PVDF powders shows a $d_{33}/d_{31}$ ratio of 3.2, as compared the same ratio of 2.2 for the corresponding bulk ceramic. The anisotropy in ceramic particle interactions is believed important in order for obtaining this mechanical anisotropy. Therefore, we prefer that the composite has a reasonably high degree of particle percolation. This can be achieved by selecting a high volume percent loading of piezoelectric ceramic particles.

Another method for introducing such desired mechanical anisotropy is to use fibers to anisotropically reinforce the polymer matrix of the ceramic composite. Preferably these fibers are preferentially oriented normal to the eventual poling direction, so that the fiber reinforcement effect is to decrease $S_{11}$ versus $S_{33}$. Such fibers are preferably wetted by the polymer component, so that these fibers can provide a maximum mechanical reinforcement effect. A host of different materials can be chosen for these reinforcing fibers, including, for example, glass fibers, fibers of organic or inorganic linear polymers, and various fiber-forming inorganic materials such as SiC, SiN, carbon fibers, and imogolite silicates. These fibers are preferably largely electrically insulating, so carbon fibers are not preferred. However, conducting reinforcing fibers can be used if the volume and distribution of such fibers does not result in fiber percolation. The volume fraction of the reinforcing fibers is preferably from about 0.1 to about 20 volume percent. The fibers used for this mechanical reinforcement function can optionally be piezoelectric fibers that provide a contribution to device piezoelectric response. Such fibers of ceramic ferroelectrics or piezoelectrics can be obtained by conventional methods, such a laser-assisted pedestal growth. Also, the piezoelectric fibers can be those of conventional piezoelectric polymers. As an alternative to the use of fibers as the matrix reinforcement aid, sheet-like, platelet, platelet-shaped, or plate-like materials can be used as long as these materials are anisotropically dispersed in the polymer matrix. An example of such sheet-like, platelet, platelet-shaped, or plate-like reinforcing material is an exfoliated clay having the sheet plane oriented parallel to the direction of eventual poling.

The existence of anisotropically reinforcing additives for the matrix phase modifies the preferred ceramic particle loading level. The preferred total of the volumes of the piezoelectric ceramic particles and the reinforcing additive materials is from about 50 to about 74 volume percent. The more preferred total loading level is from about 55 to about 70 volume percent for the piezoelectric ceramic particles and reinforcing additive materials. For the case where the matrix phase is a polymer, the total volume of all components other than the organic polymer is preferably from about 50 to about 74 volume percent of the entire composite. More preferably, the total volume of all components other than the organic polymer is from about 60 to about 67 volume percent of the entire composite. Various poling methods are applicable for the 0-3 composite of the present invention. These include DC poling, corona poling, plasma poling, pulse poling, and poling under more complicated voltage conditions which can involve various combinations of DC, AC, pulse, and corona poling at either a single temperature or a range of temperatures. One preferred method of poling is DC poling in a thermostatically temperature-controlled silicon oil bath, which is the method frequently used by investigators of piezoelectric materials. In order to ensure most complete and rapid poling, the maximum poling field should be preferably as high a field as can be applied without causing dielectric breakdown of the composite. The maximum applied poling fields for the present composite are preferably above about 120 kV/cm. Preferred poling temperatures are at least about 10° C. below the highest polymer matrix melting temperature and more preferably at least about 30° C. below the highest matrix melting temperature. There are two purposes of using high poling temperatures. First, high temperatures decrease the coercive field of the ceramic component. Second, high temperatures can increase the dielectric constant of the polymer component, so that the difference in dielectric constant between the ceramic and polymer decreases. In order to apply a high poling field, the poling field should be increased progressively from a low field that is far from the breakdown field to a field that is slightly less than the breakdown field.

A possible disadvantage of the DC poling method is that the local breakdown can short circuit the poling electrodes—thereby prevent further poling. Another preferred method is corona poling or plasma poling, which is less susceptible to short circuit effects and is well suited for the poling of large area films in a continuous commercial process.

Electrodes are required on the composite devices both for most sensor applications and for many poling methods. Such electrodes can be conveniently attached to the sample by a number of well-established methods. The most effective method is to sputter a metal coating on the composite, such as silver, gold, or aluminum. When this method is used, the temperature of samples will increase during the sputtering process, which might depole samples. Therefore, prior art methods generally sputter deposit electrodes before poling. The sputter deposition of electrodes is expensive and difficult to use for complicated configurations such as cylinders. The deposition of electrodes using conductive inks is generally preferred for invention embodiments. Silver ink, such as made commercially by Creative Materials, can be used for electrode attachment. This electrode attachment can be conveniently accomplished by applying the ink to the shaped piezoelectric composite by brushing or dipping, followed by thermal curing. This type of silver inks requires relatively high curing temperatures in the range of from about 80 to about 180° C. Since the silver ink is a low viscosity liquid, articles having complicated shapes can be dipped into the liquid and then cured. This dip-coating process is especially useful when a sensor configured as a hollow cylinder having a cylindrical open core, must be electroded. In such process, regions of the sample that should not be electrode coated are easily protected during the dipping process, such as by using adhesive tape that is latter removed. Alternately, the entire article can be dip-coated and unwanted depositions can be thereafter removed, such as by scraping or sanding.

The composites of this invention can be applied in piezoelectric devices having various designs. One of the simplest designs is one in which the piezoelectric composite is sandwiched as a film between electrodes that are sufficiently thin that they do not constrain the mechanical response of the piezoelectric composite to pressure. The simplicity advantage of this device design is countered by the fact that $d_h$ can be reduced in magnitude by the partial cancellation of the contributions of $d_{33}$, $d_{32}$, and $d_{31}$ to the hydrostatic voltage coefficient. This cancellation can be avoided by replacing the above thin electrodes by high modulus, adhesively-bound electrodes that are sufficiently thick that they largely eliminate the lateral decrease in lateral dimensions of the piezoelectric composite in response to hydrostatic pressure. Since this lateral strain is largely eliminated, the hydrostatic voltage response of the sensor does not have a significant contribution from $d_{31}$ or $d_{32}$.

In contrast with the above device designs where the hydrostatic response is dominated by $d_{33}$ for charge change and $g_{33}$ for voltage change, alternate device designs can provide responses that are dominated by $d_{31}$ and $g_{31}$. For example, the acoustic voltage sensitivity $M_h$ of end-capped cylindrical hydrophone sensors having $g_{31}=g_{32}$ are given by $r_1(g_{31}+g_{33}((r_1-r_2)/(r_1+r_2)))$, where $r_1$ and $r_2$ are, respectively, the outer and inner diameters of the tubular element of the hydrophone (see R. P. Tandon et al., Journal of Materials Science Letters 12, 1182–1184 (1993)). Hence, if $r_1$ and $r_2$ have about the same size, the acoustic voltage sensitivity is about $r_1g_{31}$. In contrast, the corresponding acoustic sensitivity of an unclamped flat-plate or open-end cylinder sensor of thickness t is $(g_{33}+2g_{31})t$ and that of a thick-electrode-clamped flat-plate sensor is approximately $g_{33}t$. These device design considerations are important for choosing the optimal combination of piezoelectric ceramic and polymer.

Alternate device designs for pressure sensors can be used in order to exploit both $g_{33}$ and $g_{31}$ for composites of this invention for which these piezoelectric coefficients have opposite signs. One example is the well-known moonie-type device design, which is described by Newman and Ruschau in the Journal of Intelligent Material Systems and Structures 4, pp. 289–294 (1993). Such flextensional devices are configured so that the effect of pressure is to apply a lateral tensile stress on the piezoelectric, so that the effects of $g_{33}$ and $g_{31}$ having opposite signs do not cancel in the voltage sensitivity coefficient for the sensor.

A disadvantage of either the cylindrical or plate-like configurations for hydrophone sensors fabricated from the composites of the present invention is that stress response is directional. This is not a problem when pressure waves are being monitored that have a wavelength that is much longer than the sensor dimensions. However, if high acoustic frequencies are being used so that small objects can be detected in a marine environment, isotropic sensor response in needed. For such applications the composites of the present invention are preferably configured in a spherical shape, with electrodes of opposite polarity on the inside and outside of the spherical sensor. Such spherical sensors are preferably fabricated by first fabricating hemispherical shapes, and by subsequently joining such hemispherical shapes to provide the spherical sensor. This processing is preferably by either injection molding or a sheet deformation process in a suitably configured mold.

A piezoelectric sensor can optionally employ either a single layer of a composite of this invention, multiple layers of said composite of this invention, or one or more layers of a composite of this invention in combination with other piezoelectric layer or layers either of this invention or of the prior art. For example, a parallel plate planar sensor can consist of a multiplicity of piezoelectric layers that are either electroded only on the outer surfaces or are each electroded on both sides and are electrically connected like capacitors which act in series. In the latter case the use of an even number of separately electroded layers places electrodes of the same polarity on the opposite outer sides of the piezoelectric layer stack, which is preferred for cases where it is desirable to use the outer electrodes for electronic shielding purposes. On the other hand the use of an odd number of such layers places the electrodes having opposite polarity on the opposite outer sides of the electrode stack, which facilitates connection of electronic leads to the sensor. As an alternative to the flat stack arrangement, a thick cylindrical sensor of this invention can be obtained by wrapping film strips of a composite of this invention in a jelly-role fashion, wherein these film strips are either electroded on both sides prior to the wrapping process or are electroded on the inner and outer surfaces of the cylinders after the wrapping process. Electroding on opposite sides of the composite layers results in an increased device capacitance, which can facilitate impedance matching with connecting cable and electronic detection systems. The opposite case where film elements are electroded on only the inner and outer surfaces of the sensor element results in a decreased capacitance for the sensor, but an increased voltage response sensitivity to applied stress.

Conventional methods are used to characterize the performance of the piezoelectric compositions of this invention. These analyses of these results led to the present understanding of the scientific basis for the present invention. The hydrostatic voltage coefficient ($g_h$) was measured using an air-calibrator. The air-calibrator consists of (1) an AC sweep generator (WAVETEK 164), (2) a cylindrically shaped air chamber with two speakers at opposite ends, (3) a charge amplifier, and (4) a spectrum analyzer (HP3585B). The AC sweep generator outputs a sinusoidal AC wave (75 Hz) to drive the two speakers to produce sound pressure waves in the air chamber. The acoustic sound pressure in the chamber was detected by either a test sample or a standard that is interfaced with the voltage amplifier. The output of the charge amplifier was analyzed by the spectrum analyzer at 75 Hz. By comparing the amplifier output of the standard and testing sample, the sensitivity ($S_r$) in dB (re 1 V/µPa) was calculated. The dielectric constant and dielectric loss tangent were determined using a HP 4261A LRC meter at 1 kHz and room temperature. The resonance frequency of selected composites was measured by using an impedance analyzer (HP 4921A LP Impedance Analyzer). These measurements were used to derive elastic compliances for piezoelectric composites.

The following specific examples are presented to more particularly illustrate the invention, and should not be construed as being limitations on the scope of the invention.

EXAMPLE 1

This example shows that record values of $g_h d_h$, as well as low dielectric loss, can be obtained by using a compliant and low dielectric loss polymer for the host matrix of the ceramic particles. This compliant polymer is low density polyethylene (Aldrich, ρ=0.915 g/cm³ and a melt index (MI) of 0.22). The ferroelectric ceramic used in this experiment and the comparative Example 2 is Ca-modified lead titanate (Ca-PT), which was prepared by sintering a spray-dried green powder at 1100° C. for 3 hours. This sintered powder was then separated into portions having different particle size ranges. The portion of the ceramic powder used in this example has a particle size between 75 µm and 106 µm. The polyethylene powder has particle sizes between 100 and 700 µm. The Ca-PT powder (20.0 g) and the polyethylene powder (1.62 g) were mixed with the aid of a small amount of hexane that helps prevent static charges. A portion of the powder mixture (2.38 g) was placed in a die and heated at 140° C. for 10 minutes and then pressed at the same temperature and 1,000 lbs force for 2.5 minutes. The resulting cylinder has an outer diameter of 1.04 cm, an inner diameter of 0.62 cm, and a length of 9.7 mm. The corresponding loading level of the ceramic powder is about 65% by volume. If not indicated otherwise, the same loading level was used in all other examples of this invention. After poling at 25 kV and 85° C. for 24 minutes, the cylinder was washed with hexane and electroded with silver ink (Creative Materials). Two days later the dielectric and piezoelectric properties were measured. The cylinder offers a free-field hydrophone sensitivity of −186.8 dB (re 1 V/µpa), a hydrostatic voltage coefficient of 0.208 mV/N, a dielectric constant of 33, a dielectric loss of 0.012, a $g_h d_h$ value of $126 \times 10^{-13}$ m²/N, and a $d_h g_h$/tanδ value of $10.5 \times 10^{-10}$ m²/N.

EXAMPLE 2 (COMPARATIVE)

This is a comparative example showing that the $g_h d_h$ value obtained for the Ca-PT composite is greatly reduced when the compliant low density polyethylene of Example 1 is replaced with much less compliant high density polyethylene. High density polyethylene (1.76 g, Aldrich, ρ=0.96 g/cm³ and MI=5.5) and the Ca-PT powder (20.0 g) having a particle size between 75 µm and 106 µm were mixed with the aid of a small amount of hexane. The above polyethylene powder was obtained by milling the corresponding pellets to obtain a particle size between 100 and 700 µm. The powder mixture (2.4 g) was placed in a die and heated at 160° C. for 10 minutes and then pressed at the same temperature and 1,000 lbs force for 2.5 minutes. The resulting cylinder has an outer diameter of 1.04 cm, an inner diameter of 0.62 cm, and a length of 9.7 mm. After poling at 25 kV and 95° C. for 20 minutes, the cylinder was washed with hexane and electroded with silver ink (Creative Materials). Two days later the dielectric and piezoelectric properties were measured. The cylinder offers a free-field hydrophone sensitivity of −191.3 dB (re 1 V/µpa), a hydrostatic voltage coefficient of 0.136 mV/N, a dielectric constant of 38, a dielectric loss of 0.011, a $g_h d_h$ value of $60 \times 10^{-13}$ m²/N, and a $d_h g_h$/tanδ value of $5.4 \times 10^{-10}$ m²/N. The composite elastic compliance measured for this composite (using the resonance method of Example 18) is about $1.2 \times 10^{-10}$ m²/N. The much higher elastic compliance measured for the composite of Example 1 ($2.5 \times 10^{-10}$ m²/N) explains the much higher figure of merit of the Example 1 composite compared with that for the composite of this example.

EXAMPLE 3

The purpose of this example is to demonstrate a simple method for characterizing the ability of different polymers to wet piezoelectric ceramics. The ceramic utilized is the Ca-PT ceramic of Examples 1 and 2. This wetting property was characterized by melting polymer pellets on a Ca-PT disk in an oven at the temperatures indicated in Table 1. When polymers have a good adhesion to the ceramic, the resulting composites generally have a higher dielectric strength, better potability, and therefore are likely to offer improved piezoelectric properties.

TABLE 1

Test of the Wetting Characteristics of Various Polymers for the Ca-PT Ceramic[a]

| Polymer | Processing Temperature (°C.) | Wetting Characters |
|---|---|---|
| Polyvinylidene difluoride | 208 | Strong |
| Low density polyethylene A[b] | 140 | Strong |
| Polytetrafluoroethylene | 344 | No Wetting |
| Ultra high molecular weight polyethylene A[c] | 177 | Strong |
| Polypropylene A[d] | 190 | Medium |
| Polypropylene B[e] | 180 | Medium |
| Low density polyethylene B[f] | 140 | Strong |
| Polycarbonate | 210 | Strong |
| Poly(tetrafluoroethylene-co-ethylene) | 280 | No Wetting |
| Poly(1-butene) | 150 | Strong |
| High density polyethylene B[g] | 160 | Weak | a) The polymers listed in this table were used for the composite preparation in the examples of this invention.
b) Polyethylene from Aldrich with a density of 0.915 g/cm³ and a melt index of 0.22.
c) Ultrahigh molecular weight polyethylene with a density of 0.94 g/cm³.
d) Polypropylene from Goodfellow with a density of 0.9 g/cm³ and a melt index of 0.8.
e) Polypropylene from Aldrich with a density of 0.9 g/cm³ and a melt index of 0.5.
f) Polyethylene from Aldrich with a density of 0.922 g/cm³ and a melt index of 1.5.
g) High density polyethylene from Aldrich with a density of 0.96 g/cm³ and a melt index of 5.5.

EXAMPLE 4 (COMPARATIVE)

This example uses the result of Example 3 to show that the inability of poly(tetrafluoroethylene) to wet the Ca-PT ceramic results in a composite that has so low a dielectric strength that the composite cannot be fully poled. Poly (tetrafluoroethylene) powder (3.78 g, Aldrich, m.p.=320° C.) having a particle size of 20 µm and Ca-PT powder (20 g) having a particle size between 73 and 106 µm were mixed. The powder mixture (2.60 g) was placed into a die, heated at 344° C. for 15 minutes, and then hot-pressed at the same temperature and 1,000 lbs for 20 minutes. The corresponding pressure was about 12,000 psi. The resulting cylinder has an outer diameter of 1.04 cm and an inner diameter of 0.62 cm. The dielectric strength of the cylinder was too low to permit poling.

EXAMPLE 5 (COMPARATIVE)

This example shows that poly(tetrafluoroethylene-co-ethylene) is not a suitable matrix for the Ca-PT powder. This is a result that was anticipated from the observation of Example 3 that this polymer does not wet the Ca-PT powder. Poly(tetrafluoroethylene-co-ethylene) powder (1.56 g, Aldrich, MI=6) having a particle size of about 500 µm and Ca-PT powder (20 g) of the previous examples were mixed. The powder mixture (2.40 g) was placed into a die, heated at 280° C. for 10 minutes, and then hot-pressed at the same temperature and 1000 lbs for 2.5 minutes. The resulting cylinder has an outer diameter of 1.04 cm and an inner diameter of 0.62 cm. The pressure applied to the composite was about the same as in example 4. The dielectric strength of the cylinder was too low for complete poling to occur at a field that do not produce dielectric breakdown.

EXAMPLE 6 (COMPARATIVE)

This example shows that ultra high molecular weight polyethylene powder is not a suitable matrix for the Ca-PT powder. This is a result that was not anticipated from the observation of Example 3. Ultra high molecular weight polyethylene powder (1.65 g, Aldrich, m.p.=138° C.) having a particle size of about 5 µm and Ca-PT powder (20.0 g) having a particle size between 73 and 106 µm were mixed. The powder mixture (2.20 g) was placed into a die, heated at 177° C. for 30 minutes, and then hot-pressed at the same temperature and 500 lbs for 30 minutes. After further pressing at 180° C. and 1,500 lbs for minutes, a cylinder with an outer diameter of 1.04 cm and an inner diameter of 0.62 cm was obtained. The processing pressure for the composite was about 18,000 psi. The dielectric strength of the cylinder was about 100 kV/cm, which was not sufficiently high for complete poling to occur. This failure of poling likely reflects the high melt viscosity (and low melt index) of this polymer, rather that the surface energy characteristics. The low melt index of this polymer prevents it from infiltrating into the space between ceramic particles. As a result voids occur, which cause dielectric breakdown and prohibit the application of the fields requires for satisfactory poling.

EXAMPLE 7

This example shows that uniaxial hot-press processing can introduce mechanical anisotropy in the resulting composite. The PZT-5H green powder manufactured by EDO Corporation was sintered at 1200° C. for 3 hours. The resulting powder has a particle size between 40 and 150 µm. This powder (20.0 g) was mixed with PVDF powder (2.63 g) and a small amount of hexane that serves as a mixing aid. The pellet having a diameter of 1.27 cm and a thickness of 1.8 mm was uniaxially pressed in a die at 200° C. and about 12,000 psi. After being poled at 100° C. and 12 kV for 20 minutes, the poled pellet was cleaned with hexane and electroded with silver ink and the ink was cured. The pellet had $d_{33}$, $d_h$, and $d_{31}$ values of 64, 25, and 20 pC/N, respectively. The anisotropy ratio was $d_{33}/d_{31}=3.2$.

EXAMPLE 8

This example shows that the lateral reinforcement of the composite in Example 7 can increase the piezoelectric anisotropy. All the composition and processing parameters are the same as those in Example 7, except that about 5 volume percent of glass fiber (having a diameter of 25 µm and a length of about 0.5 cm) was added to the composite. The pellet has $d_{33}$, $d_h$, and $d_{31}$ values of 47, 27, and 10 pC/N, respectively. The obtained value of $d_{33}/d_{31}$ was 4.7, which indicates that the glass fiber reinforcement increased the piezoelectric coefficient anisotropy.

EXAMPLE 9

Comparison of this example and example 7 shows that a decrease in the particle size of the ceramic decreases the piezoelectric anisotropy of the resultant composite, as well as the magnitudes of $d_{33}$ and $d_{31}$. Hence, the larger particle sizes are preferred in order to maximize either $d_{33}$ or $d_{31}$ and avoid cancellation effects between $d_{33}$ and $d_{31}$ in the hydrostatic response coefficient dh. The PZT-5H powder (from EDO corporation) was spray-dried and sintered at 1200° C. for 2 hours. After the powder (50 g) was grounded into the relatively fine form, it was placed into a plastic bottle with zirconia cylinders (150 g) and a small amount of acetone. Thereafter, ball milling was carried out for 12 hours. The scanning electron micrograph of the milled powder shows that the particle size is between 0.5 and 10 µm. A portion of the milled powder (32 g) and PVDF powder (3.8 g) were mixed with the aid of a small amount of hexane. A pellet having a diameter of 1.27 cm and a thickness of 0.90 mm was hot-pressed at 200° C. and 5,000 lbs. The corresponding processing pressure was about 4,000 psi. Poling was carried out at 11 kV and 100° C. for 1 hour. After cleaning with hexane, the poled pellet was electroded and its dielectric and piezoelectric properties were measured. The pellet has $d_{33}$, $d_h$, and $d_{31}$ values of 22, 5.7, and 8.2 pC/N, respectively. The anisotropy ratio $d_{33}/d_{31}$ was 2.7, as compared with the anisotropy ratio of 2.2 for the bulk PZT-5H ceramic and the anisotropy ratio of 3.2 for the ceramic composite of example 7 that utilized larger size ceramic particles.

EXAMPLE 10

This example provides results that are used in example 18 to demonstrate the effect of the elastic compliance on the piezoelectric performance of the composites. Polypropylene (1.51 g, Goodfellow, $\rho=0.9$ g/cm$^3$ and MI=0.8) and the Ca-PT powder (20.0 g) having a particle size between 75 µm and 106 µm were mixed with the aid of a small amount of hexane that helps prevent static charges. The polypropylene powder has a particle size of about 350 µm. The powder mixture (2.35 g) was placed in a die and heated at 190° C. for 10 minutes and then pressed at the same temperature and 1,000 lbs force for 10 minutes. The resulting cylinder has an outer diameter of 1.04 cm, an inner diameter of 0.62 cm, and a length of 9.7 mm. After poling at 25 kV and 90° C. for 20 minutes, the cylinder was washed with hexane and electroded with silver ink (Creative Materials). Two days later the dielectric and piezoelectric properties were measured. The cylinder offers a free-field hydrophone sensitivity of −191.8 dB (re 1 V/µpa), a hydrostatic voltage coefficient of 0.13 mV/N, a dielectric constant of 34, a dielectric loss of 0.012, a $g_h d_h$ value of $51 \times 10^{-13}$ m$^2$/N, and a $d_h g_h/\tan\delta$ value of $4.25 \times 10_{-10}$ m$^2$/N.

EXAMPLE 11

This example further provides results that are used in example 18 to demonstrate the important effect of the elastic compliance (or tensile modulus) of the polymer on the piezoelectric performance of the composite. Polypropylene (1.51 g, Aldrich, $\rho$=0.9 g/cm$^3$ and MI=0.5) and the Ca-PT powder (20.0 g) having a particle size between 75 $\mu$m and 106 $\mu$m were mixed with the aid of a small amount of hexane that helps prevent static charges. The polypropylene powder has a particle size of about 350 $\mu$m. The powder mixture (2.40 g) was placed in a die and heated at 180° C. for 10 minutes and then pressed at the same temperature and 1,000 lbs force for 10 minutes. The resulting cylinder has an exterior diameter of 1.04 cm, an inner diameter of 0.62 cm, and a length of 9.7 mm. After poling at 25 kV and 90° C. for 20 minutes, the cylinder was washed with hexane and electroded with silver ink (Creative Materials). Two days later the dielectric and piezoelectric properties were measured. The cylinder offers a free-field hydrophone sensitivity of −191.7 dB (re 1 V/$\mu$pa), a hydrostatic voltage coefficient of 0.14 mV/N, a dielectric constant of 34, a dielectric loss of 0.014, a $g_h d_h$ value of 55×10$^{-13}$ m$^2$/N, and a $d_h g_h$/tan$\delta$ value of 3.9×10$^{-10}$ m$^2$/N.

EXAMPLE 12

Comparison of the results of this example and those of Example 1 shows that not all low density polyethylenes provide the high compliances that result in superior piezoelectric performance for the polymer/ceramic composites. Only those low density polyethylenes showing high compliances provide composites having superior piezoelectric performance. Low density polyethylene (1.74 g, Aldrich, $\rho$=0.922 g/cm$^3$ and MI=1.5) and the Ca-PT powder (20.0 g) having a particle size between 53 $\mu$m and 75 $\mu$m were mixed with the aid of a small amount of hexane. The polyethylene powder has a particle size of about 350 $\mu$m. The powder mixture (2.37 g) was placed in a die and heated at 141° C. for 16 minutes and then pressed at the same temperature and 1,000 lbs force for 2.5 minutes. The resulting cylinder has outer diameter of 1.04 cm, an inner diameter of 0.62 cm, and a length of 9.7 mm. After poling at 25 kV and 90° C. for 20 minutes, the cylinder was washed with hexane and electroded with silver ink (Creative Materials). Two days later the dielectric and piezoelectric properties were measured. The cylinder offers a free-field hydrophone sensitivity of −191.6 dB (re 1 V/$\mu$pa), a hydrostatic voltage coefficient of 0.13 mV/N, a dielectric constant of 33, a dielectric loss of 0.013, a $g_h d_h$ value of 50×10$^{-13}$ m$^2$/N, and a $d_h g_h$/tan$\delta$ value of 3.8×10$^{-10}$ m$^2$/N. The elastic compliance of this composite was measured to be 1.2×10$^{-10}$ m$^2$/N, as compared with 2.5×10$^{-10}$ m$^2$/N for the Example 1 composite. The lower elastic compliance for this composite (compared with that for the composite of Example 1) results from the lower elastic compliance for low density polyethylene used for this example—which results in a lower figure of merit than for the Example 1 composite.

EXAMPLE 13

In combination with Example 1, this example shows that variation in particle size of the ceramic used for composite processing does not substantially change the piezoelectric performance of the composite as long as the particle size remains large (30 $\mu$m and above). Low density polyethylene (1.614 g, Aldrich, $\rho$=0.915 g/cm$^3$ and MI=0.22) and the Ca-PT powder (20.0 g) having a particle size between 53 $\mu$m and 75 $\mu$m were mixed with the aid of a small amount of hexane that helps prevent static charges. The polyethylene powder has a particle size between 100 and 700 $\mu$m. The powder mixture (2.38 g) was placed in a die and heated at 140° C. for 10 minutes and then pressed at the same temperature and 1,000 lbs force for 2.5 minutes. The resulting cylinder has an outer diameter of 1.04 cm, an inner diameter of 0.62 cm, and a length of 9.7 mm. After poling at 25 kV and 90° C. for 20 minutes, the cylinder was washed with hexane and electroded with silver ink (Creative Materials). Two days later the dielectric and piezoelectric properties were measured. The cylinder offers a free-field hydrophone sensitivity of −188.2 dB (re 1 V/$\mu$pa), a hydrostatic voltage coefficient of 0.193 mV/N, a dielectric constant of 31, a dielectric loss of 0.012, a $g_h d_h$ value of 102×10$^{-13}$ m$^2$/N, and a $d_h g_h$/tan$\delta$ value of 8.5×10$^{-10}$ m$^2$/N.

EXAMPLE 14

The purpose of this example is the same as for example 13. All the conditions are the same as for example 13, except that the ceramic particle size is between 30 and 53 $\mu$m. The resulting cylinder offers a free-field hydrophone sensitivity of −188.8 dB (re 1 V/$\mu$pa), a hydrostatic voltage coefficient of 0.182 mV/N, a dielectric constant of 33, a dielectric loss of 0.014, a $g_h d_h$ value of 97×10$^{-13}$ m$^2$/N, and a $d_h g_h$/tan$\delta$ value of 8.5×10$^{-10}$ m$^2$/N.

EXAMPLE 15 (COMPARATIVE)

This is a comparative example showing that the $g_h d_h$ value obtained for the Ca-PT composite is greatly reduced when the compliant polyethylene powder of Example 1 is replaced with much less compliant polyvinylidene fluoride powder (PVDF). The Ca-PT powder (10.00 g) was mixed with a PVDF polymer powder (1.525 g) that has a particle size of about 0.2 $\mu$m. The resulting powder mixture was nearly free-flowing. After heating at 208° C. for 15 minutes, this powder (1.32 g) was then hot-pressed in a die at 208° C. for 2.5 minutes under 1000 pounds force (corresponding to a pressure of about 22,000 psi). The cylinder retrieved from the die has an outer diameter of 0.96 cm, an inner diameter of 0.74 cm, and a length of about 0.95 cm. The poling of the cylinder was carried out at 115° C. and 14 kV for one hour. After electroding the surface with silver ink (Creative Materials), the dielectric and piezoelectric properties were determined. One week after poling, the cylinder showed a sensitivity of −198.6 dB (Re 1V/$\mu$Pa). The dielectric constant and dielectric loss were found to be 48 and 0.014, respectively. The cylinder has a $g_h d_h$ value of 49×10$^{-13}$ m$^2$/N, as compared with the $g_h d_h$ value of 126×10$^{-13}$ m$^2$/N from Example 1. The cylinder has a $d_h g_h$/tan$\delta$ value of 3.5×10$^{-10}$ m$^2$/N as compared with a $d_h g_h$/tan$\delta$ value of 10.5×10$^{-10}$ m$^2$/N from Example 1. Note that this composite has a $d_h$ value of 48 pC/N that is higher than the 44 pC/N measured for the composite in Example 1, but the figure of merit of this example is lower than for Example 1. This can be explained as follows. The dielectric constant of the composite is proportional to the dielectric constants of both matrix and ceramic components. The higher the dielectric constant of the components, the higher the dielectric constant of the composite. Because PVDF and HDPE have the dielectric constants of about 7.5 and 2.2, respectively, the PVDF-ceramic composite has a higher dielectric constant. On the other hand, the piezoelectric charge coefficient is proportional to the dielectric constant. This is why we found that the PVDF composite has a higher piezoelectric charge coefficient (48 vs 44). The highest piezoelectric charge coefficient observed is 64 pC/N for the PVDF composite.

Thus, when the goal is to find a higher piezoelectric charge coefficient, a high dielectric constant polymer should be considered as a matrix component. However, a high piezoelectric charge coefficient will not guarantee a high figure of merit as disclosed in this invention. The matrix compliance plays an important role.

EXAMPLE 16

This example shows that the use of a very low compliance matrix polymer (such as polycarbonate) as a host matrix yields composites that offer less attractive piezoelectric properties. Polycarbonate (1.1 g, Goodfellow, $\rho=1.29$ g/cm$^3$ and MI=5.5) and the Ca-PT powder (10.0 g) having a particle size between 75 $\mu$m and 106 $\mu$m were mixed with the aid of a small amount of hexane that helps prevent static charges. This polycarbonate powder was milled to obtain a particle size between 100 and 700 $\mu$m. The powder mixture (2.4 g) was placed in a die and heated at 210° C. for 20 minutes and then pressed at the same temperature and 1,000 lbs force for 2.5 minutes. The resulting cylinder has an outer diameter of 1.04 cm, an inner diameter of 0.62 cm, and a length of about 9.3 mm. After poled at 25 kV and 95° C. for 20 minutes, the cylinder was washed with hexane and electroded with silver ink (Creative Materials). Two days later the dielectric and piezoelectric properties were measured. The cylinder offers a free-field hydrophone sensitivity of −196.3 dB (re 1 V/$\mu$pa), a hydrostatic voltage coefficient of 0.076 mV/N, a dielectric constant of 33, a dielectric loss of 0.009, a $g_h d_h$ value of $17 \times 10^{-13}$ m$^2$/N, and a $d_h g_h$/tan$\delta$ value of $1.9 \times 10^{-10}$ m$^2$/N.

EXAMPLE 17

This example provides results that are used in example 18 to further demonstrate that the use of a highly compliant matrix polymer provides composites having superior piezoelectric performance. Poly(1-butene) (0.83 g, Aldrich, $\rho=0.91$ g/cm$^3$ and MI=5.5) was milled to obtain particle sizes between 100 and 700 $\mu$m. This milled polymer and the Ca-PT powder (10.0 g) having a particle size between 75 $\mu$m and 106 $\mu$m were mixed with the aid of a small amount of hexane that helps prevent static charges. The powder mixture (2.4 g) was placed in a die and heated at 150° C. for 20 minutes and then pressed at the same temperature and 1,000 lbs force for 2.5 minutes. The resulting cylinder has an outer diameter of 1.04 cm, an inner diameter of 0.62 cm, and a length of about 9.3 mm. After poling at 25 kV and 95° C. for 20 minutes, the cylinder was washed with hexane and electroded with silver ink (Creative Materials). Two days later the dielectric and piezoelectric properties were measured. The cylinder offers a free-field hydrophone sensitivity of −189.1 dB (re 1 V/$\mu$pa), a hydrostatic voltage coefficient of 0.18 mV/N, a dielectric constant of 32, a dielectric loss of 0.013, a $g_h d_h$ value of $87 \times 10^{-13}$ m$^2$/N, and a $d_h g_h$/tan$\delta$ value of $6.7 \times 10^{-10}$ m$^2$/N.

EXAMPLE 18

This example uses the results of the previous examples to conclude the effect of the elastic compliance of the composite on the hydrostatic sensor figure of merit. Results of this example, which are provided in FIG. 1, show that the measured figure of merit is a linear function of the elastic compliance of the composite. These composites utilized about a 65 volume percent loading of Ca-PT in an organic polymer. The particle size of this Ca-PT ceramic was between 75 and 106 $\mu$m. The organic polymers used in this study are those used in the previous examples. The resonance frequency of selected composites was measured using an impedance analyzer (HP 4921A LP Impedance Analyzer). Combining this result with the density of the composite, the $S_{33}$ elastic compliance of the composite was estimated. Based on these results, it can be seen that the $g_h d_h$ figure of merit can be maximized by maximizing the $S_{33}$ elastic compliance of the composite. This was accomplished in the present example by maximizing the elastic compliance of the organic polymer that was used as a matrix for the ferroelectric ceramic.

What is claimed is:

1. A piezoelectric composite comprising a first component that is a piezoelectric powder and a second component having three-dimensional connectivity that comprises a polymer, wherein (a) the first component comprises substantially spherical piezoelectric particles such that at least about 90 weight percent of the particles have diameters within 20% of the weight-average of the particle diameters, and the weight-average of the particle diameters ranges from about 30 $\mu$m to about 200 $\mu$m;

(b) either (1) the polymer substantially adheres to the first component when a pellet of the polymer is fully melted and then resolidified on top of a pellet of the first component or (2) the polymer, which is formed by reaction and solidification of a fluid precursor of the polymer, substantially adheres to a pellet of the first component when said reaction and solidification is done on top of a pellet of the first component;

(c) the dielectric loss of said polymer is less than about 0.02 at 1 kHz, (d) the melt index of said polymer exceeds 0.1 at a temperature within 40° C. of the polymer melting temperature if said polymer has a melting temperature;

(e) the total volume of all components of the composite other than the second component ranges from about 50 volume percent to about 74 volume percent of the composite; and (f) the elastic compliance $S_{33}$ of the piezoelectric composite ranges from about $1.5 \times 10^{-10}$ to about $6.0 \times 10^{-10}$ m$^2$/N.

2. A composite of claim 1, wherein the second component comprises an organic polymer.

3. The composite of claim 1, wherein the second component comprises an organic polymer and wherein said piezoelectric powder comprises a ferroelectric ceramic.

4. The composite of claim 3 wherein said ferroelectric ceramic comprises a relaxor ferroelectric ceramic.

5. The composite of claim 4 wherein said relaxor ferroelectric ceramic either (1) has the form A(B$\Phi_{1/2}$B$\Gamma_{1/2}$)O$_3$ or A(B$\Phi_{1/3}$B$\Gamma_{2/3}$)O$_3$, where B$\Phi$ and B$\Gamma$ represent atom types on B sites in a lead titanate type of structure, or (2) is a solid solution of one or more ceramics of such form A(B$\Phi_{1/2}$B$\Gamma_{1/2}$)O$_3$ or with another A(B$\Phi_{1/3}$B$\Gamma_{2/3}$)O$_3$, with another ceramic composition.

6. The composite of claim 5 wherein A is Pb; B$\Phi_{1/3}$ is Mg$_{1/3}$, Ni$_{1/3}$ or, Zn$_{1/3}$; B$\Gamma_{2/3}$ is Nb$_{2/3}$; and B$\Phi_{1/2}$ and B$\Gamma_{1/2}$ are any two of Sc$_{1/2}$, Ta$_{1/2}$, Fe$_{1/2}$, and Nb$_{1/2}$.

7. The composite of claim 2 wherein said organic polymer comprises low density polyethylene or poly(1-butene).

8. The composite of claim 7 wherein the first component comprises Ca-modified lead titanate.

9. The composite of claim 2 wherein the second component comprises a plasticizer.

10. The composite of claim 1 which is in the form of a shaped article having anisotropic properties.

11. The composite of claim 1 which is in the form of an open cylinder having a cylindrical open core.

12. A composite of claim 1 further comprising a third component, wherein said third component is a fibrous material or a platelet or platelet-shaped material.

13. A composite of claim 12, wherein said third component comprises glass fibers or an exfoliated clay.

14. A composite of claim 13, wherein said fibers or said exfoliated clay are anisotropically oriented in said composite.

15. A composite of claim 14 that is electrically poled, wherein the direction having the highest elastic compliance is the direction of electric poling.

16. A composite of claim 1, wherein the said composite is substantially free of voids.

17. The composite of claim 3, wherein the ferroelectric ceramic comprises $M_xM'_{1-x}NbO_3$, wherein M and M' are selected from the group consisting of Na, Li, and K and x is less than unity; $Pb_xM''_v(Ti_yM_zM'_u)O_3$, wherein M and M' are selected from the group consisting of Zn, Nb, Zr, Sb, and Mn; M'' is selected from the group consisting of Bi, La, and Nb, both x+v and y+z+u are about 1, and v is no more than about 0.05; $Na_{0.5}Bi_{0.5}TiO_3$; or $Na_{0.75}Pb_{0.125}NbO_3$.

18. A composite of claim 1 wherein the total volume of all components of the composite other than the second component ranges from about 60 volume percent to about 67 volume percent of the composite.

19. A process for forming an article which comprises
   i) forming a piezoelectric composite comprising a first component that is a piezoelectric powder and a second component having three-dimensional connectivity that comprises a polymer, wherein
      (a) the first component comprises substantially spherical piezoelectric particles such that at least about 90 weight percent of the particles have diameters within 20% of the weight-average of the particle diameters, and the weight-average of the particle diameters ranges from about 30 µm to about 200 µm;
      (b) either (1) the polymer substantially adheres to the first component when a pellet of the polymer is fully melted and then resolidified on top of a pellet of the first component or (2) the polymer, which is formed by reaction and solidification of a fluid precursor of the polymer, substantially adheres to a pellet of the first component when said reaction and solidification is done on top of a pellet of the first component;
      (c) the dielectric loss of said polymer is less than about 0.02 at 1 kHz,
      (d) the melt index of said polymer exceeds 0.1 at a temperature within 40° C. of the polymer melting temperature if said polymer has a melting temperature;
      (e) the total volume of all components of the composite other than the second component ranges from about 50 volume percent to about 74 volume percent of the composite; and
      (f) the elastic compliance $S_{33}$ of the piezoelectric composite ranges from about $1.5 \times 10^{-10}$ to about $6.0 \times 10^{-10}$ $m^2/N$; and
   ii) forming a shaped article from said composite and imparting anisotropic properties to the shaped article by subjecting it to one or more treatments selected from the group consisting of uniaxially draw, uniaxial compression, biaxial draw, biaxial compression, and shear deformation.

20. The process of claim 19 wherein said shear deformation is done by shearing the shaped article between oppositely rotating cylinders.

21. A process of forming a composite comprising a first component that is a piezoelectric powder, a second component having three-dimensional connectivity that comprises a polymer, and a third component comprising a fibrous material or a plate-like material wherein
   (a) the first component comprises substantially spherical piezoelectric particles such that at least about 90 weight percent of the particles have diameters within 20% of the weight-average of the particle diameters, and the weight-average of the particle diameters ranges from about 30 µm to about 200 µm;
   (b) either (1) the polymer substantially adheres to the first component when a pellet of the polymer is fully melted and then resolidified on top of a pellet of the first component or (2) the polymer, which is formed by reaction and solidification of a fluid precursor of the polymer, substantially adheres to a pellet of the first component when said reaction and solidification is done on top of a pellet of the first component;
   (c) the dielectric loss of said polymer is less than about 0.02 at 1 kHz,
   (d) the melt index of said polymer exceeds 0.1 at a temperature within 40° C. of the polymer melting temperature if said polymer has a melting temperature;
   (e) the total volume of all components of the composite other than the second component ranges from about 50 volume percent to about 74 volume percent of the composite; and
   (f) the elastic compliance $S_{33}$ of the piezoelectric composite ranges from about $1.5 \times 10^{-10}$ to about $6.0 \times 10^{-10}$ $m^2/N$;
   the process comprising commingling the second component and third component to form an intimate mixture and then commingling the intimate mixture with the first component.

22. A process of forming a piezoelectric composite comprising a first component that is a piezoelectric powder and a second component having three-dimensional connectivity that comprises a polymer, wherein
   (a) the first component comprises substantially spherical piezoelectric particles such that at least about 90 weight percent of the particles have diameters within 20% of the weight-average of the particle diameters, and the weight-average of the particle diameters ranges from about 30 µm to about 200 µm;
   (b) either (1) the polymer substantially adheres to the first component when a pellet of the polymer is fully melted and then resolidified on top of a pellet of the first component or (2) the polymer, which is formed by reaction and solidification of a fluid precursor of the polymer, substantially adheres to a pellet of the first component when said reaction and solidification is done on top of a pellet of the first component;
   (c) the dielectric loss of said polymer is less than about 0.02 at 1 kHz,
   (d) the melt index of said polymer exceeds 0.1 at a temperature within 40° C. of the polymer melting temperature if said polymer has a melting temperature;
   (e) the total volume of all components of the composite other than the second component ranges from about 50 volume percent to about 74 volume percent of the composite; and
   (f) the elastic compliance $S_{33}$ of the piezoelectric composite ranges from about $1.5 \times 10^{-10}$ to about $6.0 \times 10^{-10}$ $m^2/N$;

the process comprising mixing the first component and second component either as dry powders or as dry powders in combination with substantially a non-solvent for the first component and second component to form a free-flowing mixture and then forming this free-flowing mixture into a shaped composite by melting the second component.

23. A process of forming a piezoelectric composite comprising a first component that is a piezoelectric powder and a second component having three-dimensional connectivity that comprises a polymer, wherein (a) the first component comprises substantially spherical piezoelectric particles such that at least about 90 weight percent of the particles have diameters within 20% of the weight-average of the particle diameters, and the weight-average of the particle diameters ranges from about 30 µm to about 200 µm;

(b) either (1) the polymer substantially adheres to the first component when a pellet of the polymer is fully melted and then resolidified on top of a pellet of the first component or (2) the polymer, which is formed by reaction and solidification of a fluid precursor of the polymer, substantially adheres to a pellet of the first component when said reaction and solidification is done on top of a pellet of the first component;

(c) the dielectric loss of said polymer is less than about 0.02 at 1 kHz, (d) the melt index of said polymer exceeds 0.1 at a temperature within 40° C. of the polymer melting temperature if said polymer has a melting temperature;

(e) the total volume of all components of the composite other than the second component ranges from about 50 volume percent to about 74 volume percent of the composite; and (f) the elastic compliance $S_{33}$ of the piezoelectric composite ranges from about $1.5 \times 10^{-10}$ to about $6.0 \times 10^{-10}$ $m^2/N$;

the process comprising forming a mixture of the first component and a monomer or prepolymer, followed by reaction of said monomer or prepolymer under conditions sufficient to produce the second component.

* * * * *